United States Patent
Leibfritz

(10) Patent No.: US 10,288,660 B2
(45) Date of Patent: May 14, 2019

(54) COMB SIGNAL GENERATOR, MEASURING DEVICE AND METHOD

(71) Applicant: Rohde & Schwarz GmbH & Co. KG, Munich (DE)

(72) Inventor: Martin Leibfritz, Aying (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 63 days.

(21) Appl. No.: 15/648,387

(22) Filed: Jul. 12, 2017

(65) Prior Publication Data

US 2019/0018052 A1    Jan. 17, 2019

(51) Int. Cl.
*G01R 27/28* (2006.01)
*G01R 27/32* (2006.01)
*G01R 35/00* (2006.01)

(52) U.S. Cl.
CPC ............. *G01R 27/28* (2013.01); *G01R 27/32* (2013.01); *G01R 35/005* (2013.01)

(58) Field of Classification Search
CPC .................................................... G01R 27/28
See application file for complete search history.

(56) References Cited

U.S. PATENT DOCUMENTS

| | | | | | |
|---|---|---|---|---|---|
| 3,777,271 | A | * | 12/1973 | Telewski | H03B 19/00 327/113 |
| 4,800,341 | A | * | 1/1989 | Johnson | H03L 7/22 327/105 |
| 5,508,661 | A | * | 4/1996 | Keane | H01P 1/218 327/105 |
| 8,508,241 | B2 | | 8/2013 | Heuermann | |
| 9,651,646 | B2 | | 5/2017 | Torin et al. | |

* cited by examiner

*Primary Examiner* — Noam Reisner
(74) *Attorney, Agent, or Firm* — Potomac Technology Law, LLC

(57) ABSTRACT

A comb signal generator is provided. The comb signal generator includes a signal generator, which is adapted to successively generate a plurality of continuous wave signals. The comb signal generator is adapted to successively generate a comb signal from each continuous wave signal of the plurality of continuous wave signals, wherein each of the comb signals has a comb signal bandwidth. The comb signal generator is further adapted to successively generate the comb signals so as to cover a comb signal bandwidth range.

11 Claims, 7 Drawing Sheets

COMB SIGNAL GENERATOR, MEASURING DEVICE AND METHOD

TECHNICAL FIELD

The invention relates to a comb signal generator for generating a comb signal and a measuring device and a method employing such a comb signal generator.

BACKGROUND

For calibrating measuring devices, such as vector network analyzers, high accuracy phase reference signals are employed. Such signals are, for example, generated by comb generators. A comb signal is a signal consisting of a number of discrete frequency pulses that are arranged in an equidistant manner in the frequency domain.

By generating a comb signal and supplying it to a measuring port of a vector network analyzer, the phase response of the vector network analyzer over the frequency can be determined and calibrated. This is for example shown in the patent document U.S. Pat. No. 8,508,241B2.

Conventionally, comb signals are generated using step-recovery-diodes. This type of signal generation though is disadvantageous, since the number of frequency pulses is limited. Also, most of the signal power is in the low-frequency area of the generated comb signal, resulting in very low power high frequency pulses.

Accordingly, there is a need for a comb signal generator, and a measuring device employing such a comb signal generator, which allow for a high number of selectively spaced frequency pulses with a high power.

Some Example Embodiments

Embodiments of the present invention advantageously address the foregoing requirements and needs, as well as others, by providing a comb signal generator, and a measuring device employing such a comb signal generator, which allow for a high number of selectively spaced frequency pulses with a high power.

According to a first aspect of the invention, a comb signal generator is provided. The comb signal generator comprises a signal generator adapted to successively generate a plurality of continuous wave signals. The comb signal generator is adapted to successively generate a comb signal from each continuous wave signal of the plurality of continuous wave signals, wherein each of the comb signals has a comb signal bandwidth. The comb signal generator is further adapted to successively generate the comb signals so as to cover a comb signal bandwidth range. It is thereby possible to adaptively generate the comb signal, so as to have a desired number of discrete frequency pulses at a desired spacing.

According to a first example implementation form of the first aspect, the comb signal generator comprises a modulator adapted to successively modulate each of the continuous wave signals of the plurality of continuous wave signals with a control signal, thereby generating the comb signals. This allows for a very simple implementation with hardware, which is already present in typical measuring devices.

According to a second example implementation form of the first aspect, the control signal may be a rectangular signal in the time domain. Alternatively, the control signal may be a trapezoidal signal in the time domain. Alternatively, the control signal may be a triangular signal in the time domain. This allows for a very simple generation of the control signal, while at the same time achieving a high flexibility regarding the achieved comb signal.

According to a third example implementation form of the first aspect, the comb signal generator comprises a digital-analog-converter adapted to generate the control signal. This allows for a very accurate and simple generating of the control signal.

According to a fourth example implementation form of the first aspect, the comb signal generator comprises a memory adapted to store characterizing parameters of the comb signal generator, where the characterizing parameters are determined during a post manufacturing calibration of the comb signal generator, and the stored characterizing parameters of the comb signal generator are then provided during operation of the comb signal generator. This allows for having a set of reference calibration parameters for later calibration processes.

According to a fifth example implementation form of the first aspect, the comb signal generator is adapted to select the frequency of the continuous wave signal and a waveform and a frequency of the control signal based on parameters of desired comb signals. It is thereby possible to very flexibly determine the desired comb signal.

According to a second aspect of the invention, a measuring device is provided that comprises a comb signal generator according to example embodiments of the present invention.

According to a first example implementation form of the second aspect, the measuring device comprises a comb signal generator according to the above-specified first example implementation form of the first aspect. More specifically, the measuring device comprises a comb signal generator that comprises a signal generator configured to successively generate a plurality of continuous wave signals, wherein the comb signal generator is configured to successively generate a comb signal from each continuous wave signal of the plurality of continuous wave signals, wherein each of the comb signals has a comb signal bandwidth, and wherein the comb signal generator is configured to successively generate the comb signals so as to cover a comb signal bandwidth range. The measuring device further comprises at least one measuring path connected to at least one measuring port. The signal generator of the comb signal generator is adapted to generate measuring signals within the at least one measuring path. The at least one measuring path comprises a front end processor adapted to amplify and/or equalize the measuring signals. The front end processor is adapted to operate as the modulator of the comb signal generator. Further, the frontend processor may comprise a controllable amplifier and/or a damper. Further, the comb signal generator may further comprise a modulator configured to successively modulate each of the continuous wave signals of the plurality of continuous wave signals with a control signal, thereby generating the comb signals. Such embodiments allow for implementing the comb signal generator without using any additional hardware with regard to the measuring path of the measuring device.

According to a second example implementation form of the second aspect, the amplifier and/or damper comprises at least one amplifier adapted to amplify the measuring signals. This allows for a high power comb signal.

According to a third example implementation form of the second aspect, the amplifier and/or damper may comprise an attenuator adapted to adaptively attenuate the measuring signals and thereby equalize the measuring signals. By way of further example, the attenuator is adapted to operate as the modulator of the comb signal generator, by attenuating the measuring signals controlled by the control signal. It is thereby possible to implement the modulator with minimal hardware effort.

According to a fourth example implementation form of the second aspect, the measuring device comprises a comb signal generator according to the above-specified fourth example implementation form of the first aspect. More specifically, the measuring device comprises a comb signal generator that comprises a signal generator configured to successively generate a plurality of continuous wave signals, wherein the comb signal generator is configured to successively generate a comb signal from each continuous wave signal of the plurality of continuous wave signals, wherein each of the comb signals has a comb signal bandwidth, and wherein the comb signal generator is configured to successively generate the comb signals so as to cover a comb signal bandwidth range. The comb signal generator further comprises a memory configured to store characterizing parameters of the comb signal generator, and to provide the stored characterizing parameters of the comb signal generator during operation of the comb signal generator. The measuring device further comprises at least one measuring path connected to at least one measuring port. The signal generator of the comb signal generator is adapted to generate measuring signals within the at least one measuring path. The at least one measuring path comprises a front end processor adapted to amplify and/or equalize the measuring signals. The front end processor is adapted to operate as the modulator of the comb signal generator. Further, the frontend processor may comprise a controllable amplifier and/or a damper. This allows for implementing the comb signal generator without using any additional hardware with regard to the measuring path of the measuring device. The measuring device further comprises at least one further measuring port. Further, the measuring device is adapted to perform a calibration of the at least one further measuring port by generating at least one comb signal by the comb signal generator and supplying it to the at least one further measuring port, measuring characteristics of the at least one comb signal by the at least one further measuring port, comparing the characteristics of the at least one comb signal measured by the at least one further measuring path to characterizing parameters of the comb signal generator stored in the memory and calibrating the at least one further measuring path based on the comparison of the characteristics of the at least one comb signal measured by the at least one further measuring path and the characterizing parameters of the comb signal generator stored in the memory. It is thereby possible to perform an accurate calibration of the at least one further measuring port without requiring any additional external hardware outside of the measuring device.

According to a fifth example implementation form of the second aspect, the at least one measuring port may comprise a forward measuring point and a reverse measuring point. The forward measuring point is adapted to measure signals emitted by the at least one measuring path, and the reverse measuring point is adapted to measure signals emitted or reflected by at least one device under test connected to the at least one measuring port. This allows for quick and simple measurements of parameters of the device under test.

According to a sixth example implementation form of the second aspect, the measuring device comprises a comb signal generator according to the above-specified fourth example implementation form of the first aspect. More specifically, the measuring device comprises a comb signal generator that comprises a signal generator configured to successively generate a plurality of continuous wave signals, wherein the comb signal generator is configured to successively generate a comb signal from each continuous wave signal of the plurality of continuous wave signals, wherein each of the comb signals has a comb signal bandwidth, and wherein the comb signal generator is configured to successively generate the comb signals so as to cover a comb signal bandwidth range. The comb signal generator further comprises a memory configured to store characterizing parameters of the comb signal generator, and to provide the stored characterizing parameters of the comb signal generator during operation of the comb signal generator. The measuring device further comprises at least one measuring path connected to at least one measuring port. The signal generator of the comb signal generator is adapted to generate measuring signals within the at least one measuring path. The at least one measuring path comprises a front end processor adapted to amplify and/or equalize the measuring signals. The front end processor is adapted to operate as the modulator of the comb signal generator. Further, the at least one measuring port comprises a forward measuring point and a reverse measuring point. The forward measuring point is adapted to measure signals emitted by the at least one measuring path, and the reverse measuring point is adapted to measure signals emitted or reflected by at least one device under test connected to the at least one measuring port. Further, the measuring device is configured to perform a calibration of the at least one measuring path, while the at least one device under test is connected to the at least one measuring port, by (i) generating, by the comb signal generator, a comb signal, (ii) measuring the comb signal using the forward measuring point, (iii) measuring a signal reflected by the at least one device under test using the reverse measuring point, (iv) determining characteristics of the at least one comb signal from the measured comb signal, (v) comparing the characteristics of the at least one comb signal to the characterizing parameters of the comb signal generator stored in the memory, and (vi) calibrating the at least one measuring path based on the comparison of the characteristics of the at least one comb signal and the characterizing parameters of the comb signal generator stored in the memory.

According to a third aspect of the invention a measuring method, using a measuring device comprising a comb signal generator according to example embodiments of the present invention, is provided. According to a first example implementation form of the third aspect, the measuring device comprises a comb signal generator according to the above-specified fourth example implementation form of the first aspect, wherein the measuring device is adapted to perform a calibration of the at least one measuring path, while the at least one device under test is connected to the at least one measuring port. The method comprises the steps of generating a comb signal by the comb signal generator, measuring the comb signal using the forward measuring port, measuring a signal reflected by the at least one device under test by the reverse measuring point, determining characteristics of the at least one comb signal from the measured comb signal, comparing the characteristics of the at least one comb signal to characterizing parameters of the comb signal generator stored in the memory and calibrating the at least one measuring path based on the comparison of the characteristics of the at least one comb signal and the characterizing parameters of the comb signal generator stored in the memory. More specifically or alternatively, a method for calibrating a measuring device comprises: (i) generating, by a comb signal generator, a combined comb signal, wherein the comb signal generator generates the combined comb signal by successively generating a plurality of continuous wave signals and successively generating a comb signal from each of the continuous wave signals, wherein each of the comb signals has a comb signal bandwidth, and wherein the comb signal generator successively generates the comb signals to cover a comb signal bandwidth range; (ii) measuring the comb signal using a forward measuring point of the measuring device, wherein the forward measuring point is configured for measurement of signals emitted by at least one measuring path of the measuring device; (iii) measuring a signal reflected by a device under test, connected to a measuring port of the measuring device, using a reverse measuring point of the measuring device, wherein the reverse measuring point is configured for measurement of signals emitted or reflected by at the device under test; (iv) determining characteristics of the at least one comb signal from the measured comb signal; (v) comparing the characteristics of the at least one comb signal to predetermined characterizing parameters of the comb signal generator; and (vi) calibrating a measuring path of the measuring device based on the comparison of the characteristics of the at least one comb signal and the characterizing parameters of the comb signal generator. Such methods allow for performing a calibration of the first measuring path without unplugging the device under test.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

A comb signal generator, and a measuring device employing such a comb signal generator, which allow for a high number of selectively spaced frequency pulses with a high power, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

Figure 3:
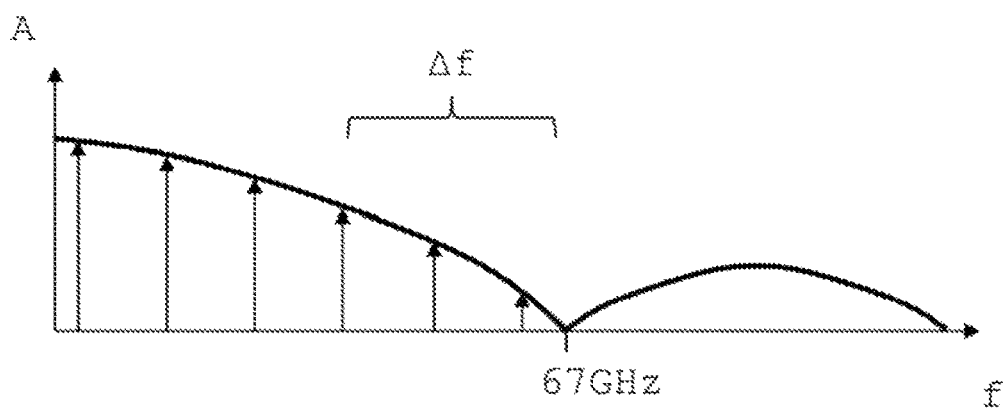
FIG. 3 shows a frequency response of an example comb signal generator.
Figure 4:
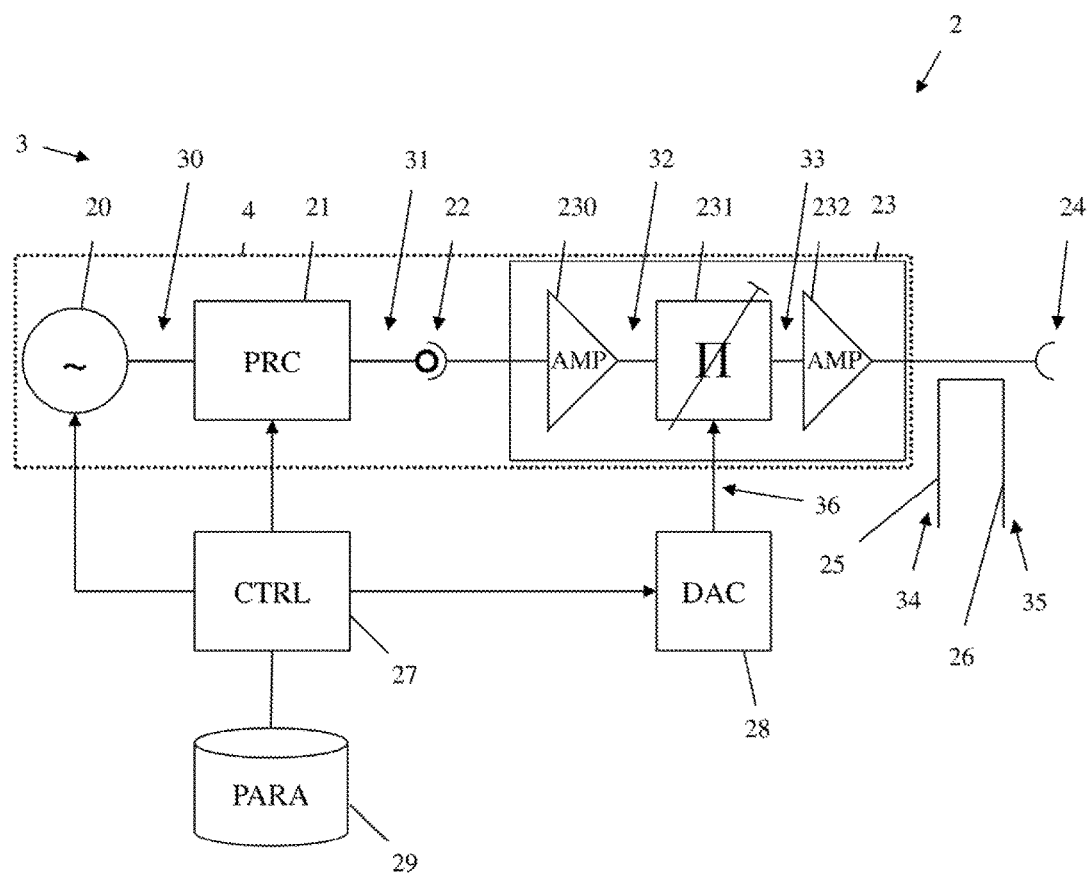
FIG. 4 shows a first example embodiment of a measuring device comprising a comb signal generator according to example embodiments of the present invention.
Figure 5A:
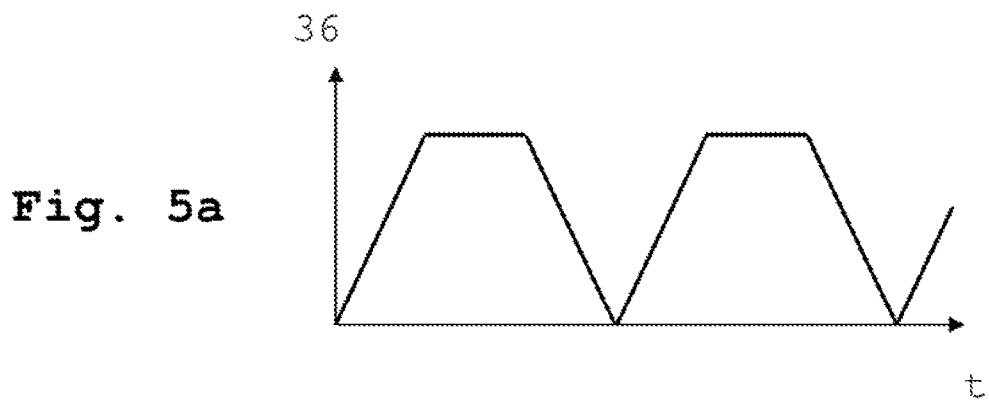
FIG. 5a shows an example control signal of a comb signal generator according to example embodiments of the present invention.
Figure 5B:
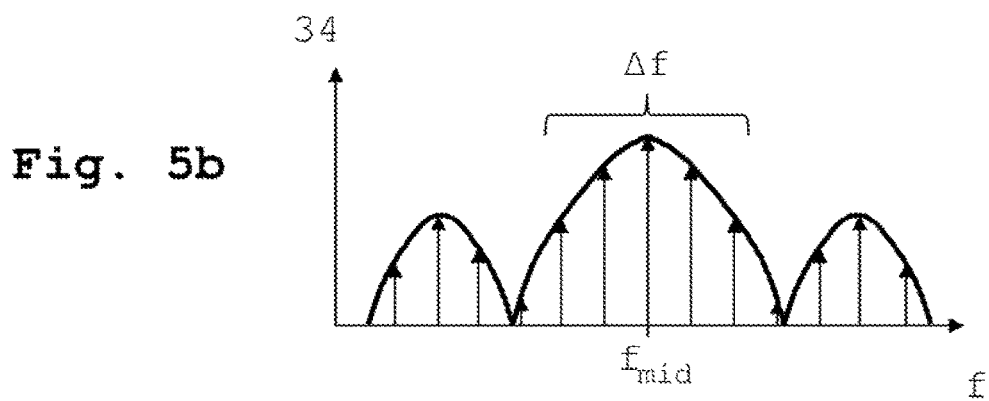
FIG. 5b shows a first example frequency response of a comb signal generator according to example embodiments of the present invention.
Figure 5C:
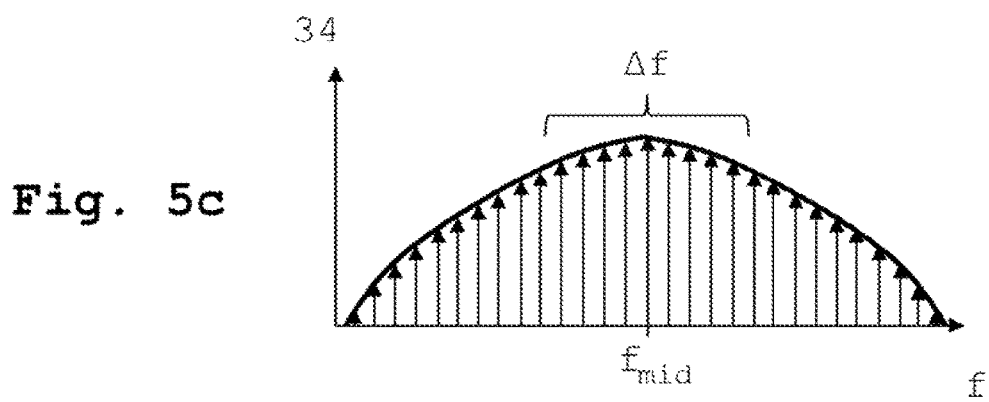
FIG. 5c shows a second example frequency response of a comb signal generator according to example embodiments of the present invention.
Figure 6:
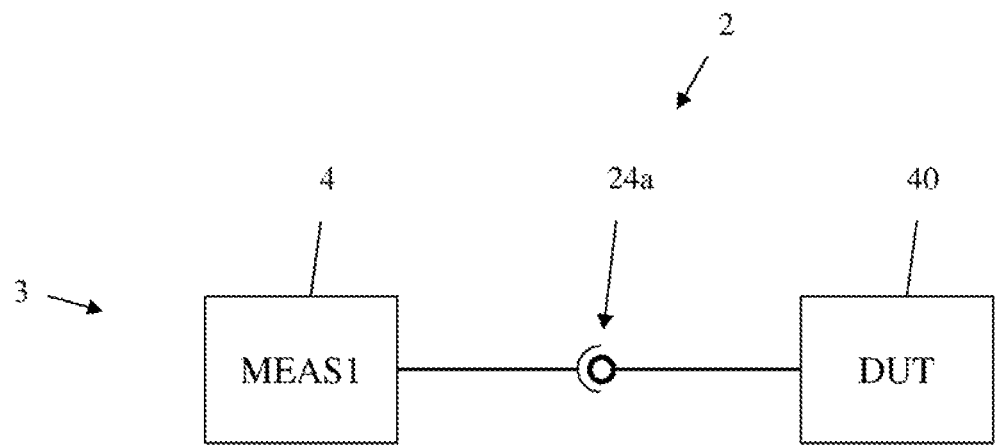
FIG. 6 shows a second example embodiment of a measuring device comprising a comb signal generator according to example embodiments of the present invention.

First, an example measuring device is described with reference to FIG. 1 to FIG. 2c. Then, with reference to FIG. 3, the disadvantages of a comb signal generator using a step-recovery-diode are explained. With reference to FIG. 4, the construction and function of a comb signal generator, and of a measuring device employing such a comb signal generator, according to the first and second aspects of the invention, are described. With reference to FIG. 5a to FIG. 5c, the function and benefits of such example embodiments of the present invention are further described. With reference to FIG. 6, further aspects of an embodiment of the measuring device according to the second aspect of the invention are described. Further, with reference to FIG. 7, further aspects and benefits of the measuring device according to the second aspect of the invention are described. With reference to FIG. 8, an embodiment of the method according to the third aspect of the invention is described. Similar entities and reference numbers in different figures have been partially omitted.

Reference will now be made in detail to example embodiments of the present invention, examples of which are illustrated in the accompanying drawings. However, the following embodiments of the present invention may be variously modified and the range of the present invention is not limited by the following embodiments.

Figure 1:
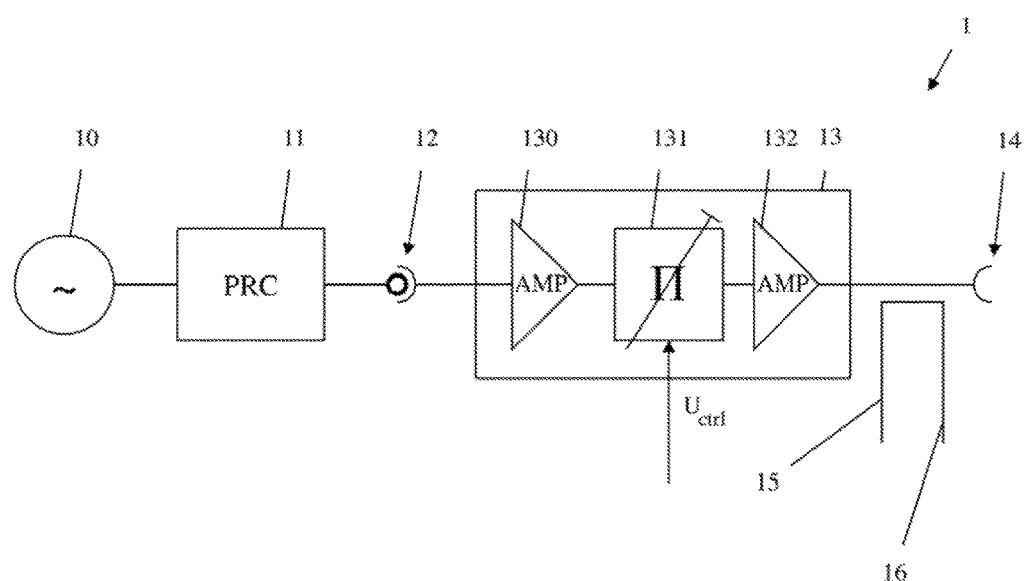
FIG. 1 shows an example measuring device.

FIG. 1 shows an example measuring device 1. The measuring device 1 comprises a signal generator 10 connected to a signal processor 11, which in turn is connected to an interface 12. Connected to the interface 12 is an amplifier and/or damper (hereinafter also referred to as a frontend processor 13), which in turn is connected to a measuring port 14. The frontend processor 13 comprises a first amplifier 130 which is connected to the interface 12, an attenuator 131, which is connected to the first amplifier 130, and a second amplifier 132, which is connected to the attenuator 131 and to the measuring port 14.

Between the frontend processor 13 and the measuring port 14, a forward measuring port or point 15 and a backwards or reverse measuring port or point 16 are arranged. When performing measurements, the measuring device 1 is connected to a device under test by the measuring port 14. The device under test is not depicted, here.

A continuous wave signal is generated by the signal generator 10. The signal processor 11 performs further processing on the continuous wave signal. For example, the signal processor 11 comprises a filter performing a filtering, and/or an amplifier performing an amplification and/or an attenuator performing an attenuation, etc. The processed continuous wave signal is handed to the interface 12, which hands it to the frontend processor 13. The frontend processor 13 performs an amplification and attenuation of the processed continuous wave signal. More specifically, the first amplifier 130 performs an amplification, the attenuator 131 performs an attenuation, and the second amplifier 132 again performs an amplification. The amplification by the amplifiers 130, 132 and also the attenuation by the attenuator 131 are controllable. More specifically, the attenuation by the attenuator 131 is controllable by a control voltage $U_{ctrl}$. The signal emitted by the frontend processor 13 can be measured by the forward measuring point 15, while a signal returned or reflected by the device under test can be measured by the backwards or reverse measuring point 16.

Figure 2A:
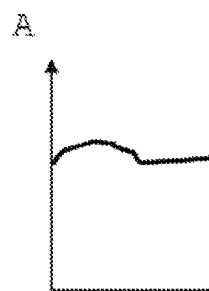
FIG. 2a shows a signal within the example measuring device of FIG. 1.
Figure 2B:
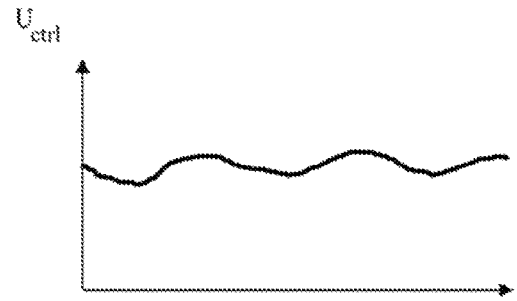
FIG. 2b shows a second signal within the example measuring device of FIG. 1.
Figure 2C:
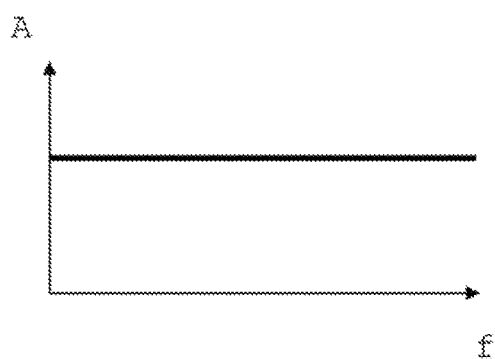
FIG. 2c shows a third signal within the example measuring device of FIG. 1.

The signal generation by the signal generator 10 and the signal processing by the signal processor 11 often has a frequency characteristic, which is depicted in FIG. 2a. With reference to FIG. 2a, the signal amplitude over the frequency of the signal at the interface 12 is shown. In order to achieve a linear frequency characteristic of the measuring signal handed to the device under test, the amplifiers 130, 132 and/or the attenuator 131 are controlled in order to mitigate the non-linear frequency characteristic. For example, a control voltage $U_{ctrl}$ is applied to the attenuator 131 dependent upon the frequency, which is shown in FIG. 2b. A resulting linear frequency characteristic of the resulting signal handed to the measuring port 14 is shown in FIG. 2c.

For calibration purposes, it is useful to have comb signals as phase reference. A comb signal consists of a number of evenly spaced frequency pulses. In an ideal comb signal, the frequency pulses all have the same amplitude and the entire comb signal has an infinite bandwidth. Currently, however, such comb signals cannot be generated. So far, comb signals are usually generated by use of step-recovery-diodes. An example frequency characteristic of such a comb signal is shown in FIG. 3. As shown in FIG. 3, only the frequency pulses beneath the main lobe of the signal can be used. In practice, the cutoff point of the main lobe is for example at 67 GHz. Here, it can readily be seen that the power of the individual frequency pulses deteriorates as one gets closer to the cutoff point. Moreover, due to construction limitations, it is only possible to generate around 50 frequency pulses within the entire bandwidth up to 67 GHz. The individual frequency pulses are thus more than 1 GHz apart in the frequency domain. Moreover, if a large bandwidth of the resulting comb signal is desired, the power distribution is uneven. This means that the individual frequency pulses have a strong frequency characteristic, as can be seen in FIG. 3. As can be seen here, within a desired frequency range Δf only a few frequency pulses of the comb signal exist.

First Embodiment

In order to mitigate the foregoing described disadvantages of a comb signal generation by use of a step-recovery-diode, the hardware of a measuring device (e.g., a vector network analyzer) can be used without the need for additional hardware. Accordingly, FIG. 4 shows a first example embodiment of a measuring device 2 comprising a comb signal generator 3 according to example embodiments of the present invention. The measuring device 2 comprises a continuous wave signal generator 20 connected to a signal processor 21, which is connected to an interface 22. The interface 22 is connected to an amplifier and/or damper (which may hereinafter be referred to as the frontend processor 23), which is connected to a measuring port 24.

The frontend processor 23 further comprises a first amplifier 230 connected to the interface 22 and an attenuator 231 connected to the first amplifier 230. Further, the frontend processor 23 comprises a second amplifier 232, connected to the attenuator 231 and to the measuring port 24.

Between the frontend processor 23 and the measuring port 24, a forward measuring point 25 and a backwards or reverse measuring port or point 26 are arranged. The measuring device 2 further comprises a controller 27, connected to the signal generator 20 and the signal processor 21. The controller 27 is connected to a digital analog converter 28, which is connected to the attenuator 231. Further, the measuring device 2 comprises a memory or parameter storage 29, which is connected to the controller 27. The signal generator 20, the signal processor 21 and the frontend processor 23 are referred to as measuring path 4.

The function of the signal generator 20, the signal processor 21 and the frontend processor 23, as well as the measuring port and the forward and backwards measuring points, parallels that of the measuring device shown in FIG. 1 (while in measuring mode).

For generating a comb signal, according to example embodiments, the signal generator 20 generates a continuous wave signal 30 and hands it to the signal processor 21. The signal processor 21 performs signal processing resulting in a processed continuous wave signal 31. This signal 31 is handed to the first amplifier 230, which performs a first amplification resulting in an amplified signal 32. This amplified signal is handed to the attenuator 231, which performs an attenuation. The attenuation though is not performed with a constant signal, but with a variable control signal 36. This control signal 36 varies in such a speed that the attenuator 231 in fact performs a modulation of the amplified signal 32, resulting in a modulated signal 33. This signal 33 is amplified by the second amplifier 232, resulting in a measuring signal 34 which is output at the measuring port 24 and measured as signal 34 at the forward measuring point. Further, the backwards measuring point 26 is adapted to measure a signal 35, which enters from the measuring port 24 side.

The control signal 36 is provided by the digital analog converter 28 controlled by the controller 27. Also the function of the signal generator 20 and the signal processor 21 is controlled by the controller 27.

Further, within the parameter storage 29, parameters of the comb signal generator 3 are stored. These parameters are determined after construction so as to have a base line reference for later calibrations.

Second Embodiment

FIG. 5a shows an example control signal 36 of a comb signal generator according to example embodiments of the present invention. The control signal here has a trapezoidal shape in the time domain. Alternatively, a rectangular shape or a triangular shape can be employed.

Third Embodiment

FIG. 5b shows a first example frequency response of a comb signal generator according to example embodiments of the present invention. Modulating the amplified signal 32 with the control signal 36 leads to the measuring signal 34, as shown in FIG. 5b. As is apparent, the maximum of the resulting signal distribution is not at a frequency of 0 Hz, but at a frequency $f_{mid}$. A usable frequency range of the comb signal $\Delta f$ extends around the frequency $f_{mid}$. Also here it can be seen that the signal amplitude deteriorates the further from $f_{mid}$ one gets.

Fourth Embodiment

FIG. 5c shows a second example frequency response of a comb signal generator according to example embodiments of the present invention. The frequency response of FIG. 5c is achieved by modification of the frequency distribution of the measuring signal 34, based on the selection of the parameters of the modulation signal 36 and the frequency of the continuous wave signal 30, which can readily be seen in FIG. 5c. Here, the number of usable frequency components within the range $\Delta f$ has been significantly increased. Also the amplitude distribution is far more linear than in FIG. 5b.

With this mode of generating a comb signal, the usable bandwidth is limited. According to further example embodiments, however, by successively generating different continuous wave signals with different frequencies. and modulating them with according modulation signals, it is possible to successively generate a number of comb signals, which when stitched together cover a desired comb frequency range.

Fifth Embodiment

FIG. 6 shows a second example embodiment of a measuring device 2 comprising a comb signal generator 3 according to example embodiments of the present invention. Here, only the measuring path 4 and the measuring port 24a, which corresponds to the measuring port 24, are shown. A device under test 40 is connected to the measuring port 24a. With this setup, measurements on the device under test 40 using only a single measuring port 24a of the measuring device 2 are performed. In order to perform a calibration, without having to disconnect the device under test 40, the comb signal generator 3 generates a comb signal and measures it using the forward measuring point 25. By comparison of the measured comb signal to comb signal parameters stored in the parameter storage 29, it is possible to perform a calibration without having to disconnect the device under test.

Sixth Embodiment

Figure 7:
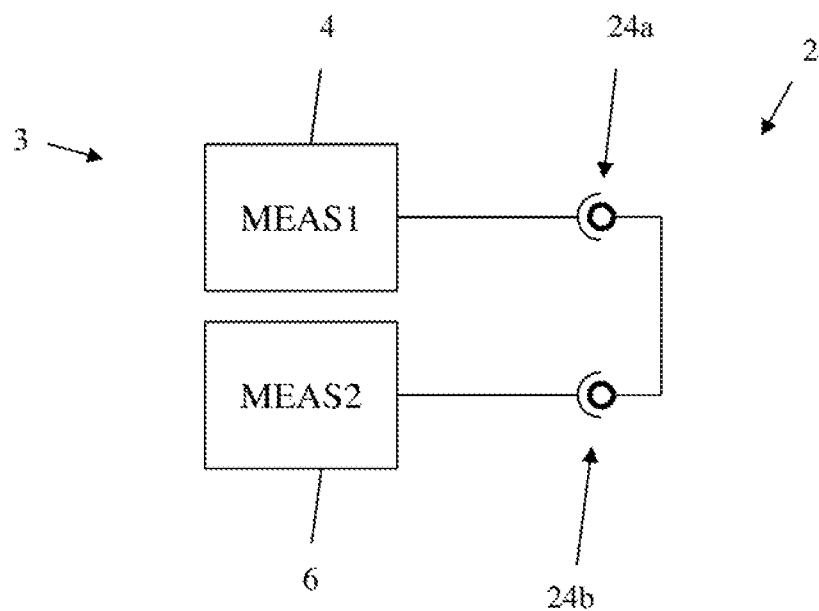
FIG. 7 shows a third example embodiment of a measuring device comprising a comb signal generator according to example embodiments of the present invention.
Figure 8:
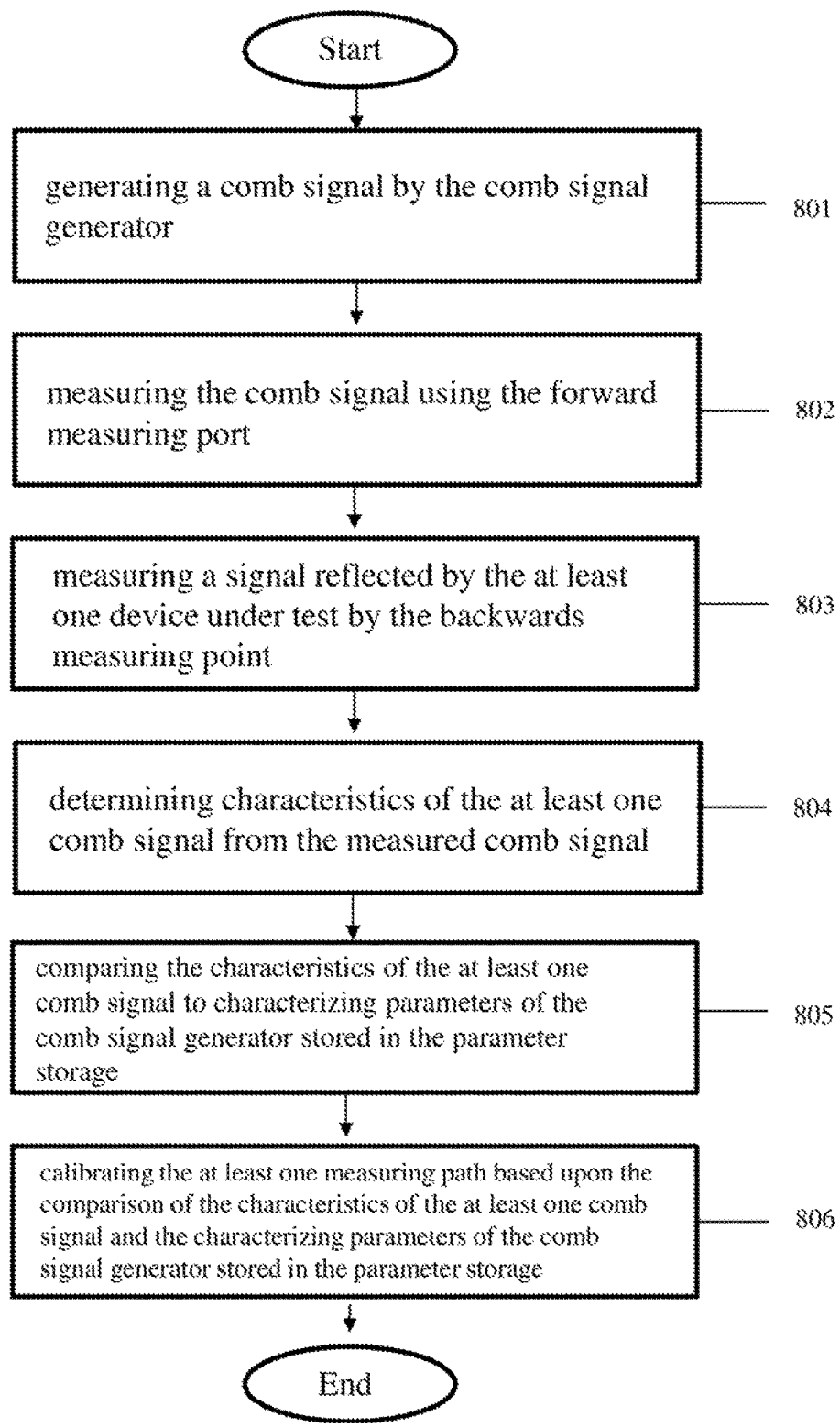
FIG. 8 shows a flow chart of a measuring method employing a comb signal generator according to example embodiments of the present invention.

FIG. 7 shows a third example embodiment of a measuring device 2 comprising a comb signal generator 3 according to example embodiments of the present invention. Here, only the measuring paths 4, 6 and the measuring ports 24a, 24b, which each corresponds to the measuring port 24, are shown. The measuring device 2 has two measuring ports 24a and 24b, each connected to a measuring path (measuring paths 4 and 6, respectively). The first measuring path 4 is used as a comb signal generator 3 and generates a comb signal as explained before. This comb signal is handed to the second measuring port 24b and the response is received therefrom. More specifically, this received signal is measured. Parameters of the comb signal are determined by the second measuring path 6 and are compared to the parameters stored in the parameter storage 29. Based on this comparison, a calibration of the second measuring path 6 is possible.

FIG. 8 shows a flow chart of a measuring method employing a comb signal generator according to example embodiments of the present invention. With reference to FIG. 8, the method comprises the following steps: (Step 801) generating a comb signal by the comb signal generator; (Step 802) measuring the comb signal using the forward measuring port; (Step 803) measuring a signal reflected by the at least one device under test by the backwards measuring point; (Step 804) determining characteristics of the at least one comb signal from the measured comb signal; (Step 805) comparing the characteristics of the at least one comb signal to characterizing parameters of the comb signal generator stored in the parameter storage; and (Step 806) calibrating the at least one measuring path based on the comparison of the characteristics of the at least one comb signal and the characterizing parameters of the comb signal generator stored in the parameter storage.

Further, where the measuring device comprises additional measuring paths, and corresponding measuring ports, a calibration of such further measuring ports is also possible as explained above. The presently shown calibration is not limited to vector network analyzers, but can also be performed on signal generators or other measurement equipment such as spectrum analyzers or oscilloscopes.

Example embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means. The characteristics of the example embodiments can be used in any advantageous combination.

Although the present invention and its advantages have been described in detail, it should be understood, that various changes, substitutions and alterations can be made herein without departing from the spirit and scope of the invention as defined by the appended claims.

What is claimed is:
1. A comb signal generator, comprising:
   a signal generator adapted to successively generate a plurality of continuous wave signals,
   wherein the comb signal generator is adapted to generate a plurality of comb signals by successively generating a comb signal from each of the plurality of continuous wave signals, wherein each such comb signal has a comb signal bandwidth, and wherein the plurality of comb signals cover a comb signal bandwidth range, and
   wherein the comb signal generator further comprises a modulator adapted to successively modulate each of the continuous wave signals with a control signal, thereby generating the plurality of comb signals, and
   wherein the control signal is a rectangular signal in the time domain, a trapezoidal signal in the time domain or a triangular signal in the time domain.
2. The comb signal generator of claim 1, wherein the comb signal generator comprises a digital-analog-converter adapted to generate the control signal.

3. The comb signal generator of claim 1, wherein the comb signal generator comprises a parameter storage adapted to store characterizing parameters of the comb signal generator that were determined during a post manufacturing calibration, and to provide the stored characterizing parameters of the comb signal generator during operation of the comb signal generator.

4. The comb signal generator according to claim 1, coupled with a measuring device,
wherein the measuring device comprises at least one measuring path connected to at least one measuring port,
wherein the signal generator of the comb signal generator is adapted to generate measuring signals within the at least one measuring path,
wherein the at least one measuring path comprises a controllable amplifier and/or damper adapted to amplify and/or equalize said measuring signals, and
wherein the amplifier and/or damper is adapted to operate as the modulator of the comb signal generator.

5. The comb signal generator according to claim 4, further comprising a frontend processor, wherein the frontend processor comprises at least one amplifier adapted to amplify said measuring signals.

6. The comb signal generator according to claim 4, wherein one or more of the amplifier and damper comprises an attenuator adapted to adaptively attenuate said measuring signals thereby equalizing said measuring signals, and wherein said attenuator is adapted to operate as the modulator of the comb signal generator by attenuating the measuring signals controlled by said control signal.

7. The comb signal generator according to claim 4,
wherein the comb signal generator comprises a parameter storage adapted to store characterizing parameters of the comb signal generator that were determined during a post manufacturing calibration, and to provide the stored characterizing parameters of the comb signal generator during operation of the comb signal generator,
wherein the measuring device comprises at least one further measuring path connected to at least one further measuring port, and
wherein the measuring device is adapted to perform a calibration of the at least one further measuring path by generating at least one comb signal by the comb signal generator and supplying it to the at least one further measuring port, measuring characteristics of the at least one comb signal by the at least one further measuring path, comparing the characteristics of the at least one comb signal measured by the at least one further measuring path to the characterizing parameters of the comb signal generator stored in the parameter storage, and calibrating the at least one further measuring path based upon the comparison of the characteristics of the at least one comb signal measured by the at least one further measuring path and the characterizing parameters of the comb signal generator stored in the parameter storage.

8. The comb signal generator according to claim 4,
wherein the at least one measuring port comprises a forward measuring point and a backwards measuring point,
wherein the forward measuring point is adapted to measure signals emitted by the at least one measuring path, and
wherein the backwards measuring point is adapted to measure signals emitted or reflected by at least one device under test connected to the at least one measuring port.

9. The comb signal generator according to claim 8,
wherein the comb signal generator comprises a parameter storage adapted to store characterizing parameters of the comb signal generator that were determined during a post manufacturing calibration, and to provide the stored characterizing parameters of the comb signal generator during operation of the comb signal generator, and
wherein the measuring device is adapted to perform a calibration of the at least one measuring path, while said at least one device under test is connected to the at least one measuring port, by measuring the comb signals via the forward measuring point, measuring at least one signal reflected by the at least one device under test via the backwards measuring point, determining characteristics of the comb signals based on the measuring of the comb signals, comparing the characteristics of the comb signals to the characterizing parameters of the comb signal generator stored in the parameter storage, and calibrating the at least one measuring path based upon the comparison of the characteristics of the comb signals and the characterizing parameters of the comb signal generator stored in the parameter storage.

10. A comb signal generator comprising:
a signal generator adapted to successively generate a plurality of continuous wave signals,
wherein the comb signal generator is adapted to generate a plurality of comb signals by successively generating a comb signal from each of the plurality of continuous wave signals, wherein each such comb signal has a comb signal bandwidth, and wherein the plurality of comb signals cover a comb signal bandwidth range, and
wherein the comb signal generator further comprises a modulator adapted to successively modulate each of the continuous wave signals with a control signal, thereby generating the plurality of comb signals, and
wherein the comb signal generator is adapted to select the frequency of the continuous wave signal and a waveform and a frequency of the control signal based upon parameters of desired comb signals.

11. A method for calibrating a measuring path of a measuring device that is connected to a measuring port of the measuring device, while a device under test is connected to the measuring port, the method comprising the steps of:
generating at least one comb signal by a comb signal generator, wherein the at least one comb signal is generated by the comb signal generator by generating at least one continuous wave signal and modulating each of the at least one continuous wave signal with a control signal, wherein the control signal is a rectangular signal in the time domain, a trapezoidal signal in the time domain or a triangular signal in the time domain, and wherein each comb signal has a comb signal bandwidth,
storing characterizing parameters of the comb signal generator that were determined during a post manufacturing calibration, and providing the stored characterizing parameters of the comb signal generator during operation thereof, measuring the at least one comb signal via a forward measuring point of the measuring port adapted to measure signals emitted by the measuring path, measuring at least one reflection signal reflected by the device under test via a backwards measuring point adapted to measure signals emitted or reflected by the device under test, determining characteristics of the at least one comb signal based on the measuring of the at least one comb signal, comparing the characteristics of the at least one comb signal to the characterizing parameters of the comb signal generator stored in the parameter storage, and calibrating the measuring path based upon the comparison of the characteristics of the at least one comb signal and the characterizing parameters of the comb signal generator stored in the parameter storage.

\* \* \* \* \*